US008963500B2

(12) United States Patent
Rutkowski et al.

(10) Patent No.: US 8,963,500 B2
(45) Date of Patent: Feb. 24, 2015

(54) SYSTEM AND METHOD FOR A BATTERY PACK OUTPUT CONTACTOR

(75) Inventors: Brian D. Rutkowski, Ypsilanti, MI (US); Brian C. Moorhead, Willis, MI (US)

(73) Assignee: A123 Systems LLC, Livonia, MI (US)

( * ) Notice: Subject to any disclaimer, the term of this patent is extended or adjusted under 35 U.S.C. 154(b) by 578 days.

(21) Appl. No.: 13/376,568

(22) PCT Filed: Jun. 8, 2010

(86) PCT No.: PCT/US2010/037710
§ 371 (c)(1),
(2), (4) Date: Dec. 15, 2011

(87) PCT Pub. No.: WO2010/144399
PCT Pub. Date: Dec. 16, 2010

(65) Prior Publication Data
US 2012/0080938 A1    Apr. 5, 2012

Related U.S. Application Data

(60) Provisional application No. 61/185,765, filed on Jun. 10, 2009.

(51) Int. Cl.
*H02J 7/00* (2006.01)
*H01M 10/44* (2006.01)
*H01M 2/10* (2006.01)
*H01M 10/42* (2006.01)
*G01R 31/36* (2006.01)
*H01M 10/0525* (2010.01)

(52) U.S. Cl.
CPC .......... *H01M 10/441* (2013.01); *H01M 2/1077* (2013.01); *H01M 10/425* (2013.01); *H02J 7/0063* (2013.01); *G01R 31/3658* (2013.01); *H01M 10/0525* (2013.01); *Y02T 10/7011* (2013.01)
USPC ........................................... 320/121; 320/116

(58) Field of Classification Search
CPC ... G01R 31/3658; Y02E 60/12; H02J 7/0021; H02J 7/0022; H02J 7/0024; H02J 7/0016; H02J 7/0026; H02J 7/1423; Y02T 10/7055
USPC ........................................................ 320/121
See application file for complete search history.

(56) References Cited

U.S. PATENT DOCUMENTS

| | | | | |
|---|---|---|---|---|
| 5,898,291 A * | 4/1999 | Hall | ............... | 320/121 |
| 5,959,368 A * | 9/1999 | Kubo et al. | ............... | 307/18 |
| 6,239,579 B1 * | 5/2001 | Dunn et al. | ............... | 320/121 |
| 7,915,859 B2 * | 3/2011 | Kim | ............... | 320/126 |
| 8,174,237 B2 * | 5/2012 | Kosugi et al. | ............... | 320/116 |
| 2001/0001533 A1 * | 5/2001 | Stuck Andersen et al. | ... | 320/150 |
| 2002/0053896 A1 * | 5/2002 | Adams et al. | ............... | 320/121 |

(Continued)

OTHER PUBLICATIONS

ISA Korean Intellectual Property Office, International Search Report of PCT/US2010/037710, Jan. 3, 2011, 3 pages.

*Primary Examiner* — Arun Williams
(74) *Attorney, Agent, or Firm* — Alleman Hall McCoy Russell & Tuttle LLP

(57) ABSTRACT

Systems and methods for controlling the output of a battery pack are disclosed. In one example, a battery pack contactor is closed after receiving a request to open the battery pack contactor during a power-up sequence. The system and method may reduce battery pack degradation.

20 Claims, 7 Drawing Sheets

(56) References Cited

U.S. PATENT DOCUMENTS

| | | | |
|---|---|---|---|
| 2003/0038611 A1* | 2/2003 | Morgan | 320/121 |
| 2004/0189248 A1 | 9/2004 | Boskovitch et al. | |
| 2007/0080662 A1 | 4/2007 | Wu | |
| 2008/0018299 A1* | 1/2008 | Renda | 320/116 |
| 2008/0157717 A1* | 7/2008 | Weston et al. | 320/126 |
| 2008/0252257 A1 | 10/2008 | Sufrin-Disler et al. | |
| 2008/0258683 A1* | 10/2008 | Chang | 320/112 |
| 2009/0278497 A1* | 11/2009 | Kim | 320/126 |

* cited by examiner

SYSTEM AND METHOD FOR A BATTERY PACK OUTPUT CONTACTOR

CROSS REFERENCE TO RELATED APPLICATIONS

This application is a U.S. National Phase of International (PCT) Application Serial No. PCT/US2010/037710, filed Jun. 8, 2010 and entitled SYSTEM AND METHOD FOR A BATTERY PACK OUTPUT CONTRACTOR, which claims priority from U.S. Provisional Patent Application Ser. No. 61/185,765, filed Jun. 10, 2009 and entitled ROBUST VEHICLE INTERFACE, the entirety of both of which are hereby incorporated herein by reference for all intents and purposes.

TECHNICAL FIELD

The present description relates to controlling a battery pack output contractor. In one example, the battery pack provides power to a vehicle.

BACKGROUND AND SUMMARY

A battery pack may include one or more contactors for selectively electrically coupling a battery pack output to an electrical load that is external to the battery pack. In some battery pack configurations, one contactor may be allocated to controlling a pre-charge circuit which includes a current limiting resistor in series with the battery pack output terminals. The pre-charge circuit allows the battery pack to supply a limited amount of current to a vehicle power grid or bus such that the bus can be charged without a large in-rush current. Once the vehicle power bus is charged a second contactor is engaged directly coupling battery cells to the vehicle bus. In this way, it is possible to limit current in-rush during vehicle power up so that vehicle side power control components do not have to be significantly over-sized.

One way of controlling the battery pack output contactors is to have a vehicle controller send a power request or a close contactor request to the battery pack controller. When the battery controller receives the power request, the contactors are closed providing power to the vehicle power bus. This configuration allows the vehicle controller to couple or uncouple electrical devices from the vehicle power bus before power is applied to the vehicle power bus. Thus, the vehicle controller can set the vehicle power bus in a state that is appropriate for accepting charge from the battery. However, during a vehicle reset condition or during vehicle controller degradation, it may be possible for the vehicle controller to request closure of battery pack output contactors when the vehicle bus is not in a condition desirable for closing contactors. If the battery pack contactors are closed when the vehicle power bus is not configured for a contactor closing operation, degradation of the contactor or pre-charge resistor or vehicle components may occur.

The inventors herein have recognized that it may be desirable to follow a procedure before closing battery pack output contactors. Accordingly, the inventors herein have developed a method for controlling output of a battery pack having a battery control module and a battery pack output contactor, comprising: resetting said battery control module; powering-up said battery control module from reset; receiving a request from an external controller to open the battery pack output contactor in the powered-up battery control module; and closing the battery pack output contactor after the reset only in response to the receiving request being a first instruction received from the external controller since the reset.

By first requiring opening of a battery pack output contactor during a battery control module power-up, it is possible to increase the probability that a controller external to the battery pack is operating in a desired mode before closing the battery pack output contactor. For example, if a battery controller experiences a power-up condition, it may be judged by the battery controller that a controller external to the battery pack is operating as expected when the first instruction from the external controller to the battery pack controller is an instruction to open a battery pack output contactor. When the battery pack controller receives the expected opening instruction, the probability increases that the vehicle controller has set the vehicle power bus in a desired state before charge from the battery pack is applied to the vehicle power bus. In this way, the possibility of applying battery power to the vehicle bus before the vehicle bus is ready to receive power may be reduced.

The present description may provide several advantages. In particular, the method can reduce the possibility of connecting battery output to a vehicle voltage bus when the vehicle voltage bus is not configured to accept battery power. Further, the present description may reduce system cost since it requires no additional hardware.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION OF THE DEPICTED EMBODIMENTS

Figure 1:
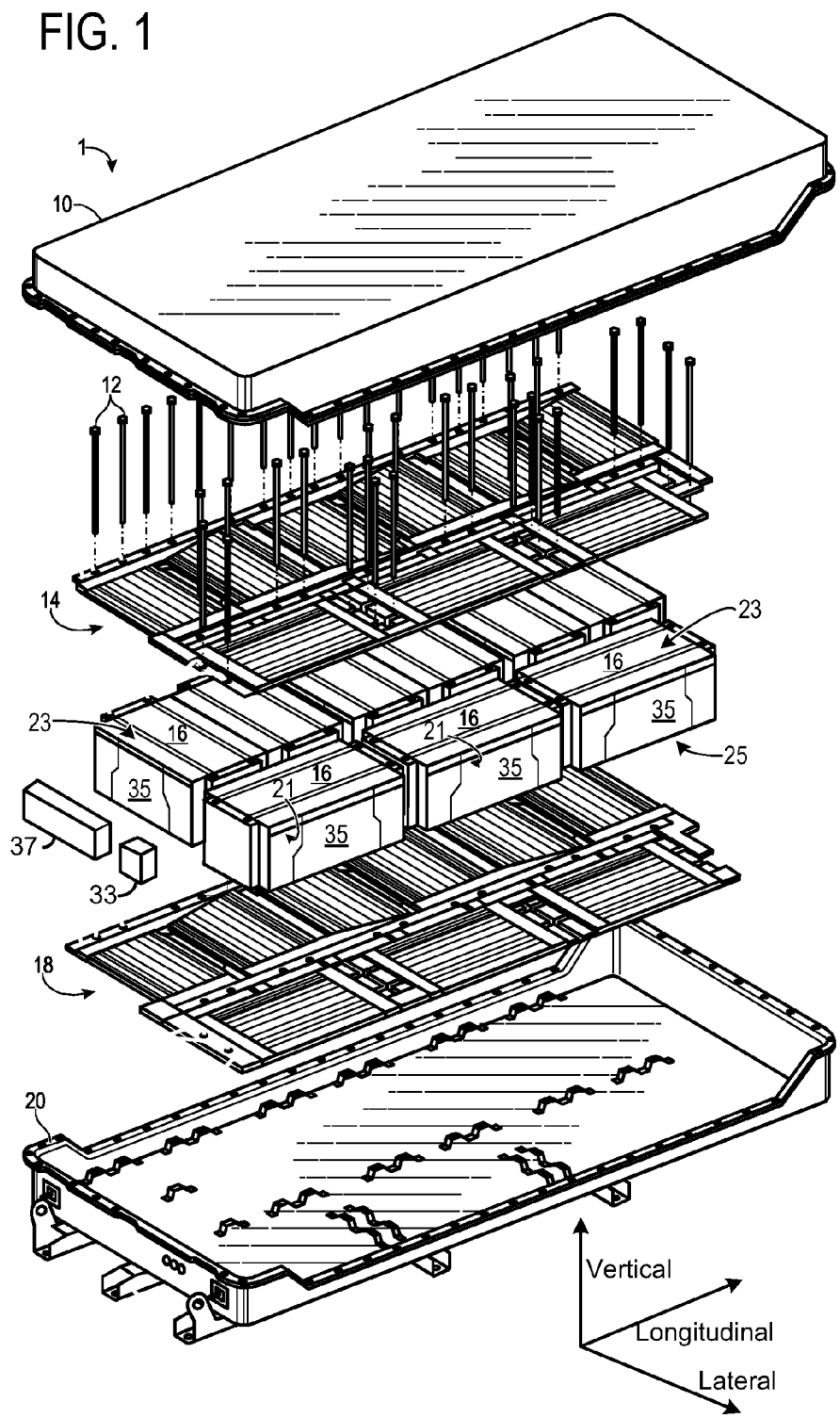
FIG. 1 shows an exploded schematic view of a battery pack or assembly.

The present description is related to controlling the output contactors of a battery pack. In one embodiment, battery cells such as those illustrated in FIGS. 2-3 may be combined in a battery pack as illustrated in FIG. 1. The power from the battery cells may be selectively delivered to a load external to the battery pack via contactors as shown in FIG. 4. In one example illustrated by the method of FIG. 8 a battery pack output contactor is permitted to close after a controller external the battery pack requests that battery contactors be placed in an open state.

FIG. 1 shows an exploded view of a battery assembly 1. The battery assembly may include a cover 10, coupling devices 12, a first cooling subsystem 14 (e.g., cold plate), a plurality of battery modules 16, a second cooling subsystem 18 (e.g., cold plate), and a tray 20. The cover may be attached to the tray via a suitable coupling device (e.g., bolts, adhesive, etc.,) to form a housing surrounding the coupling devices, the cooling subsystems, and the battery modules, when assembled.

The battery modules 16 may include a plurality of battery cells configured to store energy. Although a plurality of battery modules are illustrated, it will be appreciated that in other examples a single battery module may be utilized. Battery modules 16 may be interposed between the first cooling subsystem 14 and the second cooling subsystem 18, where the battery modules are positioned with their electrical terminals on a side 21 facing out between the cooling subsystems.

Each battery module may include a first side 23 and a second side 25. The first and the second side may be referred to as the top and bottom side, respectively. The top and bottom sides may flank the electrical terminals, discussed in greater detail herein with regard to FIGS. 2-3. In this example, the top side of each battery module is positioned in a common plane in the battery assembly. Likewise, the bottom side of each battery module is positioned in another common plane in the battery assembly. However, in other examples only the top side or the bottom side of each battery module may be positioned in a common plane. In this way, the cooling subsystems may maintain direct contact with the top sides and the bottom sides of the battery modules to increase heat transfer and improve cooling capacity, as described in further detail herein, wherein the cooling subsystems and the battery modules may be in face-sharing contact. Additional details of an exemplary battery module are described herein with regard to FIGS. 2-3. In alternate examples, only one of the cooling subsystems may be included in battery assembly 1, such as an upper cooling subsystem (subsystem 14 in this example). Moreover, the position, size, and geometry of the first and second cooling subsystems are exemplary in nature. Thus, the position, size, and/or geometry of the first and/or second cooling subsystems may be altered in other examples based on various design parameters of the battery assembly.

Battery assembly 1 may also include an electrical distribution module 33 (EDM), monitor and balance boards 35 (MBB), and a battery control module 37 (BCM). Voltage of battery cells in battery modules 16 may be monitored and balanced by MBBs that are integrated onto battery modules 16. Balancing battery cells refers to equalizing voltages between a plurality of battery cells in a battery cell stack. Further, battery cell voltages between battery cell stacks can be equalized. MBBs may include a plurality of current, voltage, and other sensors. The EDM controls the distribution of power from the battery pack to the battery load. In particular, the EDM contains contactors for coupling high voltage battery power to an external battery load such as an inverter. The BCM provides supervisory control over battery pack systems. For example, the BCM may control ancillary modules within the battery pack such as the EDM and cell MBB, for example. Further, the BCM may be comprised of a microprocessor having random access memory, read only memory, input ports, real time clock, output ports, and a controller area network (CAN) port for communicating to systems outside of the battery pack as well as to MBBs and other battery pack modules.

Figure 2:
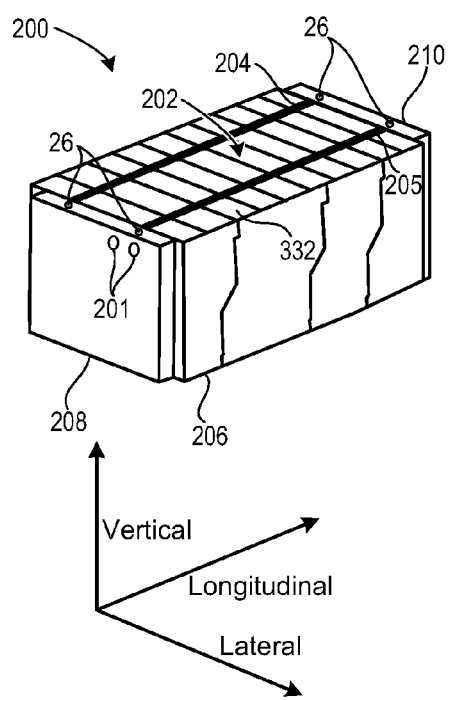
FIG. 2 shows a schematic view of an exemplary battery module.

FIG. 2 shows an exemplary battery module 200 that may be included in the plurality of battery modules 16, shown in FIG. 1. Battery module 200 may include a battery cell stack having a plurality of stacked battery cells and output terminals 201. The stacked arrangement allows the battery cells to be densely packed in the battery module.

Figure 3:
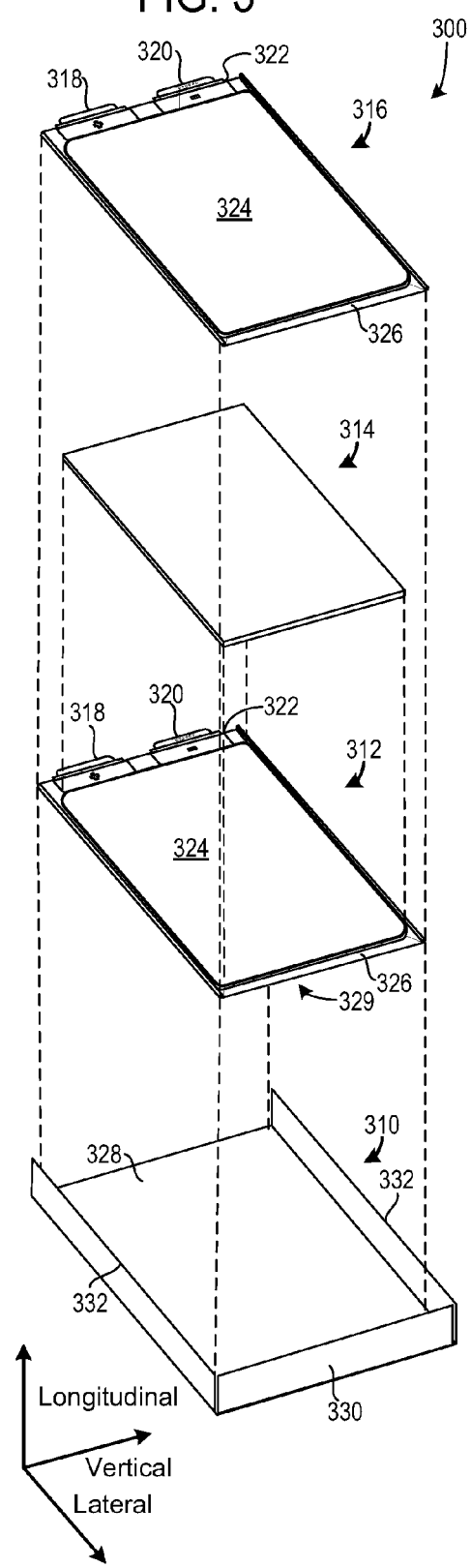
FIG. 3 shows an exploded schematic view of an exemplary battery cell stack.
Figure 4:
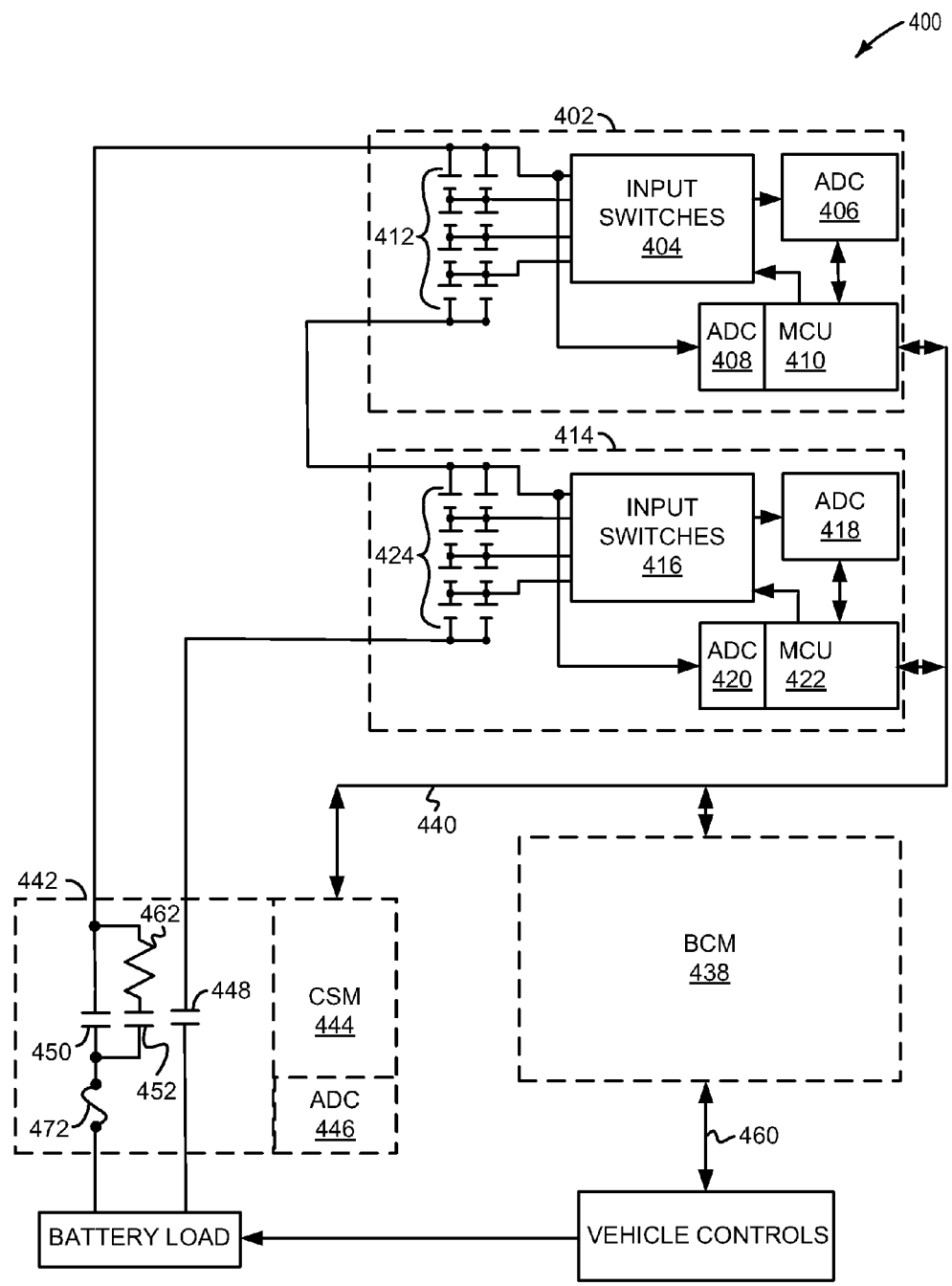
FIG. 4 shows an electrical schematic diagram for controlling battery pack output.

FIG. 3 shows an exploded view of a portion of an exemplary battery cell stack 300. As shown the battery cell stack is built in the order of a housing heat sink 310, battery cell 312, compliant pad 314, battery cell 316, and so on. However, it will be appreciated that other arrangement are possible. For example, the battery cell stack may be built in the order of a housing heat sink, battery cell, housing heat sink, etc. Further in some examples, the housing heat sink may be integrated into the battery cells.

Battery cell 312 includes cathode 318 and anode 320 for connecting to a bus bar (not shown). The bus bar routes charge from one battery cell to another. A battery module may be configured with battery cells that are coupled in series and/or parallel. Bus bars couple like battery cell terminals when the battery cells are combined in parallel. For example, the positive terminal of a first battery cell is coupled to the positive terminal of a second battery cell to combine the battery cells in parallel. Bus bars also couple positive and negative terminal of battery cell terminals when it is desirable to increase the voltage of a battery module. Battery cell 312 further includes prismatic cell 324 that contains electrolytic compounds. Prismatic cell 324 is in thermal communication with cell heat sink 326. Cell heat sink 326 may be formed of a metal plate with the edges bent up 90 degrees on one or more sides to form a flanged edge. In the example of FIG. 3, two opposing sides include a flanged edge. However, other geometries are possible. Battery cell 312 is substantially identical to battery cell 316. Therefore similar parts are labeled accordingly. Battery cells 312 and 316 are arranged with their terminals in alignment and exposed. In battery module 200 shown in FIG. 2 the electric terminals are coupled to enable energy to be extracted from each cell in the battery module. Returning to FIG. 3, compliant pad 314 is interposed between battery cell 312 and battery cell 316. However, in other examples the compliant pad may not be included in the battery cell stack.

Housing heat sink 310 may be formed by a metal plate having a base 328 with the edges bent up 90 degrees on one or more sides to form a flanged edge. In FIG. 3 longitudinally aligned edge 330 and vertically aligned edges 332 are bent flanged edges. As depicted, the housing heat sink is sized to receive one or more battery cells. In other words, one or more battery cells may be positioned within base 328. Thus, the flanged edges of the battery cells may be in contact with housing heat sink and underside 329 of battery cell 312 may be in contact with the base of the housing heat sink, facilitating heat transfer.

One of the longitudinally aligned edges 332 of the housing heat sink 310 may form a portion of the top side 202 of battery module 200, as shown in FIG. 2. Similarly, one of the longitudinally aligned edges 332 may form a portion of the bottom side of the battery module. Thus, the longitudinally aligned edges of the housing heat sink may be in contact with the first and the second cooling subsystems to improve heat transfer. In this way, heat may be transferred from the battery cells to the exterior of the battery module.

The battery cells may be strapped together by binding bands 204 and 205. The binding bands may be wrapped around the battery cell stack or may simply extend from the front of the battery cell stack to the back of the battery cell stack. In the latter example, the binding bands may be coupled to a battery cover. In other embodiments, the binding bands may be comprised of threaded studs (e.g., metal threaded studs) that are bolted at the ends. Further, various other approaches may be used to bind the cells together into the stack. For example, threaded rods connected to end plates may be used to provide the desired compression. In another example, the cells may be stacked in a rigid frame with a plate on one end that could slide back and forth against the cells to provide the desired compressive force. In yet other embodiments, rods held in place by cotter pins may be used to secure the battery cells in place. Thus, it should be understood that various binding mechanisms may be used to hold the cell stack together, and the application is not limited to metal or plastic bands. Cover 206 provides protection for battery bus bars (not shown) that route charge from the plurality of battery cells to output terminals of the battery module.

The battery module may also include a front end cover 208 and a rear end cover 210 coupled to the battery cell stack. The front and rear end covers include module openings 26. However, in other examples the module openings may be included in a portion of the battery module containing battery cells.

Various methods are available to determine battery state of charge. By knowing the state of charge of a battery cell it is possible to determine whether or not the battery cell may accept additional charge. Further, by knowing the state of charge of a battery cell it is possible to determine when it is undesirable to further discharge a battery cell. One method of determining battery state of charge includes determining battery cell voltage.

Referring now to FIG. 4, a schematic diagram for controlling battery pack output is shown. In this example, battery pack 400 includes two battery cell stacks 402 and 414 as indicated by the dashed lines. Battery cells 412 and 424 are shown identically configured and are connected in series. However, battery cell stacks may be configured with different numbers of battery cells, and the battery cells may be configured differently if desired. For example, battery cells 412 and 424 are comprised of eight battery cells each. Four of the battery cells are arranged in series. Further, the four battery cells are arranged in parallel with four other battery cells that are arranged in series. In this configuration, each battery cell stack 402 and 414 outputs a voltage that is related to the number of battery cells connected in series as well as the individual voltage output of each battery cell. And, as discussed above, the current capacity or amp-hour rating of the battery cell stack may be related to the number of battery cells connected in parallel. As the number of battery cells arranged in parallel increases, the battery cell stack amp-hour rating increases. As the number of battery cells arranged in series increases, the output voltage of the battery cell stack increases. Thus, the voltage output of a battery pack can be increased or decreased by changing the number of battery cells arranged in a series connection. Likewise, the battery pack amp-hour rating may be increased or decreased by changing the number of battery cells arranged in parallel. Therefore, in this example, the battery pack voltage may be increased by adding additional battery cells in series with the battery cells of battery cell stacks 402 and 414. Alternatively, the battery cell stack amp-hour rating may be increased by adding more battery cells in parallel to battery cells 412 and 524.

Battery cell stacks 402 and 414 include input switches 404 and 416 for selectively coupling ADCs 406 and 418 to battery cells 412 and 424 respectively. MCUs 410 and 422 control the state of switches 404 and 416 by way of digital outputs from the respective MCUs. Input switches 404 and 416 are configured such that ADCs 406 and 418 may be coupled to individual battery cells to measure battery cell voltage without being influenced by the voltage of battery cells that may be placed in series with the battery cell being measured. In one embodiment, each MCU 410 and 422 may couple each series connected battery cell to respective ADCs 406 and 418. When battery cells are coupled in parallel, input switches 404 and 416 couple ADCs 406 and 418 to the battery cells of a cell stack that are coupled in parallel. Thus, each ADC coupled to a battery cell stack may be configured to measure the voltage of one or more battery cells coupled in parallel within the respective battery cell stack.

ADCs 406 and 418 are configured as high resolution (e.g., 12 or 16 bit resolution ADCs) devices that are external or off chip from MCUs 410 and 418 although ADCs may be on chip in other embodiments and may have different resolutions (e.g., 8 bit resolution). In one example, ADCs 406 and 418 communicate with MCUs 410 and 422 respectively by way of SPI ports. The SPI ports are used to transfer battery cell voltages to each MCU as the individual MCUs command input switches 404 and 416 to cycle through battery cells 412 and 424 respectively. By cycling through the switches, individual series battery cells are coupled to ADCs 406 and 418 for determining battery cell voltages.

ADCs 408 and 420 are lower resolution (e.g., 8 bit resolution) devices that are integrated to MCUs 410 and 422. In alternate embodiments, ADCs 408 and 420 may be of higher resolution (e.g., 12 or 16 bit resolution) and external from MCUs 410 and 422. ADCs 408 and 420 are configured to measure the series voltage provided by battery cells 412 and 424 for the respective battery cell stacks 402 and 414. For example, ADC 408 is configured to measure the voltage provided by the series combination of four battery cells coupled in parallel to four other battery cells, the battery cells indicated at 412. Thus, the ADC of an MBB is configured to measure the series combination of battery cells of a battery cell stack. Of course, an ADC of a MBB coupled to a battery cell stack may be configured to measure the voltage of additional or fewer battery cells than the four battery cells shown in FIG. 4. Further, as discussed above, the series combination of battery cells 412 acts to increase the output voltage of the battery cell stack 402.

MCUs 410 and 422 control input switches 404 and 416 as well as ADCs 406 and 408, 418, and 420. Further, MCUs 410 and 422 may store the respective battery voltages to memory and perform arithmetic and logical operations on battery voltage data captured by ADCs 406, 408, 418, and 420.

BCM 438 communicates with MCUs 410 and 422 of battery cell stacks 402 and 414 by way of CAN bus 440. BCM 438 may acquire battery voltages and status indicators (e.g., flags that indicate degradation of an ADC, battery cell, or MCU) from battery cell stacks 402 and 414. BCM 438 also communicates with EDM 442 via hardwired digital inputs and outputs for opening and closing primary output contactor 450, pre-charge battery output contactor 452, and low-side contactor 448. In an alternative embodiment, BCM 438 may communicate to EDM 442 via CAN 440 for sending instructions to close primary output contactor 450, pre-charge battery output contactor 452, and low-side contractor 448 when it is determined to couple battery cell stacks 402 and 414 to the battery load or source.

Primary battery output contactor 450, pre-charge battery output contactor 452, and low-side contactor 448 act as electrically controlled switches and do not interrupt short circuit current without instructions from BCM 438. In one example, primary battery output contactor 450, pre-charge battery output contactor 452, and low-side contactor 448 are normally open contactors and include a closing coil. The contactors have metallic contacts that may be engaged and disengaged to metallic current carrying conductors by operating the closing coil. In one example, the contactors open by physically moving apart from current carrying conductors. In another example where battery output requirements are lower, the battery pack contactor may be a silicon based contactor, a FET or IGBT for example.

Pre-charge resistor 462 reduces current flow between battery cells 412 and 424 when pre-charge battery output contactor 452 is closed and when primary battery output contactor 450 is open as compared to when primary battery output contactor 450 is closed. During an operating sequence to deliver battery power to an external load, low side contactor 448 is closed before pre-charge battery output contactor 452, and pre-charge battery output contactor 452 is closed before primary battery output contactor 450 is closed in order to limit current flow between the battery pack and an external load. By first closing pre-charge battery output contactor 452, charge is supplied to an external load at a rate that allows voltage of the load to increase before full battery capacity is available to the external load. In this way, current flowing from the battery pack to the external load may be reduced. In other examples, pre-charge battery output contactor 452 is closed before low side contactor 448, and low side contactor 448 is closed before primary battery output contactor 450. After primary contractor 450 is closed, pre-charge battery output contactor 452 may be opened so that no current flows from the battery to an external load when primary battery output contactor 450 is opened.

A CSM 444 may be integrated with the EDM or may be configured as a soel module. CSM 444 includes an ADC 446 for measuring battery pack current and/or on the battery side of contactors 450, 452, and 448. Fuse 472 is provided to limit current entering or leaving the battery pack.

Thus, the system of FIG. 4 provides for a system for controlling output of a battery pack, comprising: a plurality of battery cells; a first battery pack output contactor; and a battery controller, said battery controller including instructions for receiving a request from an external controller to open said first battery pack output contactor after said battery controller is powered-up, and said battery controller including further instructions for closing said first battery pack output contactor only in response to the received request being a first instruction received from a module external the battery pack since said power-up. The system may be configured such that the first battery pack output contactor is electrically coupled in series between said plurality of battery cells and a load external to said battery pack. The system can also include where the first battery pack output contactor is a normally open contactor including a closing coil and metallic contacts. In one example, the system is configured such that a first battery pack output contactor is configured to control current flow through a pre-charge resistor, and where a second battery pack output contactor is electrically coupled in series between the plurality of battery cells and an external load. Further, the second battery pack output contactor electrically is coupled in series with the first battery pack output contactor. In one example, the battery controller includes instructions for indicating a condition of degradation to said controller external to said battery pack. In another example, the controller external to said battery pack is a vehicle controller or a stationary power system controller, and the battery controller includes instructions for holding the first battery pack output contactor in an open state when the first request is not a request to open said first battery pack output contactor. Finally, the system can include a plurality of battery cells that are configured in a plurality of battery modules, and where said plurality of battery cells are lithium-ion battery cells.

The system of FIG. 4 also provides for a system for controlling output of a battery pack, comprising: a plurality of battery cells; a first module including: a first battery pack output contactor, said first battery pack output contactor configured to regulate current flow between said plurality of battery cells and a load external to said battery pack, said first battery pack output contactor also configured to regulate current flow through a pre-charge resistor; and a second battery pack output contactor, said second battery pack output contactor configured to regulate current flow between said plurality of battery cells and a load external to said battery pack, said second battery pack output contactor electrically coupled in parallel to said first battery pack output contactor; a second module including a controller in communication with said first module, said battery controller including instructions for receiving a request from an external controller to open said first battery pack output contactor after said battery controller is powered-up, and said battery controller including further instructions for closing said first battery pack output contactor only in response to the received request being a first instruction received from a module external the battery pack since said power-up. The system can also include a CAN link from said controller to the controller external to said battery pack. In one example, the system has a controller including further instructions for indicating a condition of degradation to the controller external to said battery pack. In another example, the system has a controller including further instructions for holding the first battery pack output contactor in an open state when the first request is not a request to open the first battery pack output contactor. The system can include a plurality of battery cells that are configured in a plurality of battery modules, and where the plurality of battery cells are lithium-ion battery cells. The system can also include a controller with further instructions for closing said first battery pack output contactor before the second battery pack output contactor, and instructions for opening the first battery pack output contactor after closing the second battery pack output contactor.

The system of FIG. 4 also provides for a system for controlling output of a battery pack, comprising: a plurality of battery cells; a first battery pack output contactor; and a battery controller, the battery controller including instructions for receiving a first contactor control request since initialization of the battery controller, the first contactor control request from an external controller and indicating a request to open or close the first battery pack output contactor, the battery controller including further instructions for holding the first battery pack output contactor open in response to the first contactor control request, the battery controller including further instructions for receiving a subsequent contactor control request after the first contactor control request, the subsequent contactor control request a request to close the battery pack output contactor, and the battery controller including further instructions for closing the battery pack output contactor in response to the subsequent contactor control request only in response to the first contactor control request being a contactor open request.

The system of FIG. 4 also provides for a system for controlling output of a battery pack, comprising: a plurality of battery cells; a first module including: a first battery pack output contactor, the first battery pack output contactor configured to regulate current flow between the plurality of battery cells and a load external to said battery pack, the first battery pack output contactor also configured to regulate current flow through a pre-charge resistor; and a second battery pack output contactor, the second battery pack output contactor configured to regulate current flow between the plurality of battery cells and a load external to the battery pack, the second battery pack output contactor electrically coupled in parallel to the first battery pack output contactor; a second module including a controller in communication with the first module, the controller including instructions for receiving a first contactor control request since initialization of the controller, the first contactor control request from an external controller and indicating a request to open or close the first battery pack output contactor, the controller including further instructions for holding the first battery pack output contactor open in response to the first contactor control request, the controller including further instructions for receiving a subsequent contactor control request after the first contactor control request, the subsequent contactor control request a request to close the first battery pack output contactor, the controller including further instructions for closing the first battery pack output contactor in response to the subsequent contactor control request only in response to the first contactor control request being a contactor open request, and the controller including further instructions for closing the second battery pack output contactor after closing the first battery pack output contactor.

Figure 5:
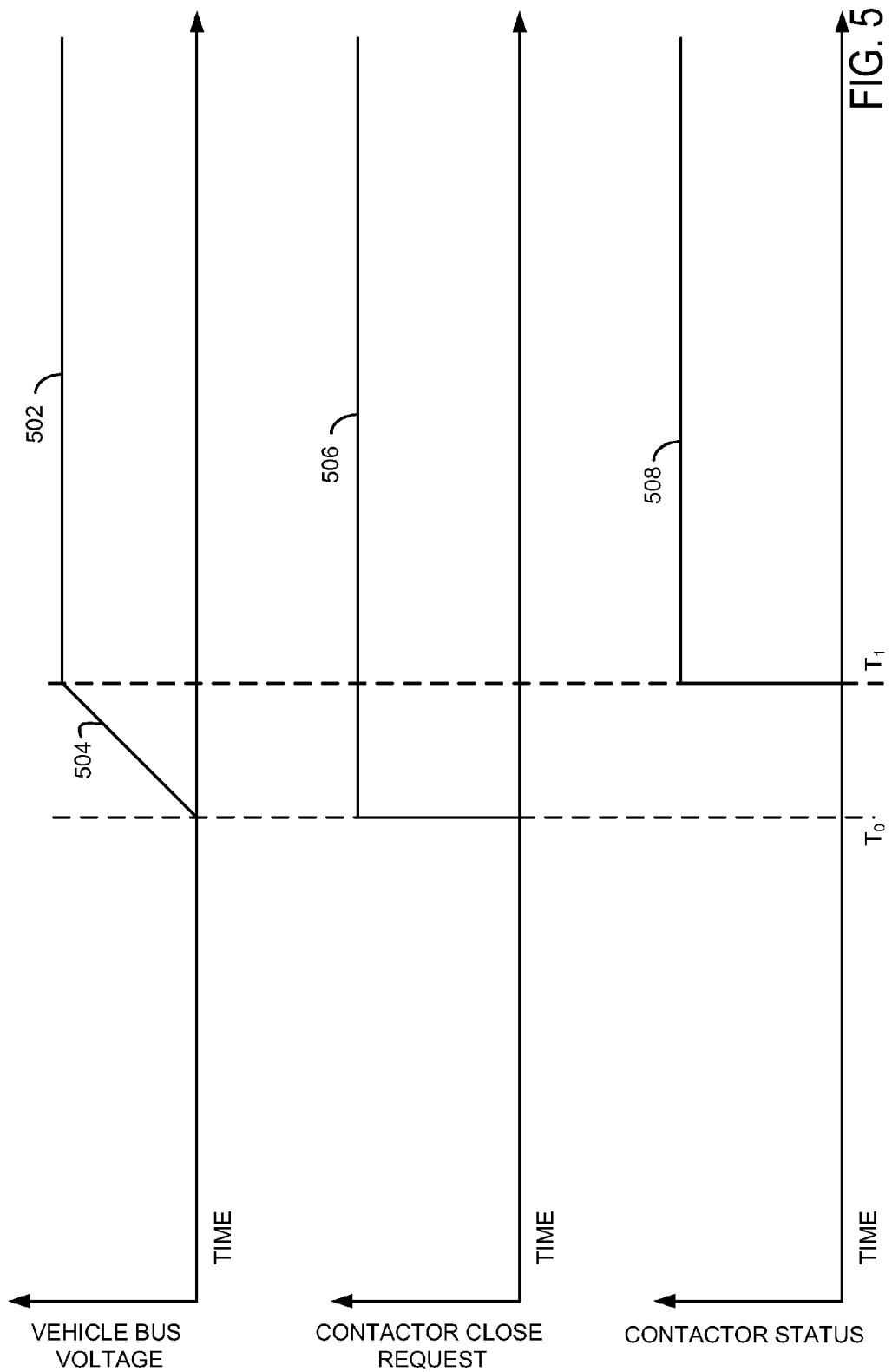
FIG. 5 shows an example plot of simulated signals of interest during expected battery pack operating conditions.

Referring now to FIG. 5, an example plot of simulated signals of interest during expected battery pack operating conditions is shown. In particular, the signals of FIG. 5 represent signals of interest during normal operation of a battery pack. During normal operation, the battery control module is executing instructions and opens and closes the battery output contactor or contactors in response to commands from a vehicle controller.

The first plot from the top of FIG. 5 is a plot of vehicle bus voltage. The X-axis represents time, and time increases from left to right. The Y-axis represents vehicle bus voltage, and voltage increases from the bottom to the top of the Y-axis.

The second plot from the top of FIG. 5 represents a contactor close request generated by a vehicle controller, for example. The X-axis represents time, and time increases from left to right. The Y-axis represents a presence or absence of a contactor close request. When trace 506 is high, a contactor close request is present. When trace 506 is low, a contactor close request is not present. The presence of a contactor close request indicates that the vehicle controller desires battery voltage at the vehicle power bus. In one example, the battery control module closes a pre-charge battery output contactor then closes a primary battery output contactor after a predetermined time or after a vehicle bus reaches a threshold voltage. Once the primary battery output contactor is closed the pre-charge battery output contactor is opened.

The third plot from the top of FIG. 5 represents a contactor status signal. The X-axis represents time, and time increases from the left to the right. The Y-axis represents the battery pack output contactor status. When trace 508 is high, the battery pack output contactor status indicates that the battery pack contactor is closed. In one example, the contactor status signal goes to a high state when a primary battery output contactor couples battery cells to the load external the battery pack bypassing the pre-charge resistor. It should be noted that the pre-charge resistor may be bypassed by closing both the pre-charge battery output contactor and the primary battery output contactor. When trace 508 is low, the battery pack output contactor status indicates that the primary battery output contactor is open.

At time to the left of $T_0$, vehicle bus voltage is low indicating that the vehicle load is not receiving power from the battery pack. Further, the contactor close request and the contactor status signals are low indicating that the battery output contactor or contactors are open.

At $T_0$ the vehicle bus voltage 502 begins to increase at 504 in response to the contactor close request changing state from low to high. In one example, the contactor close request causes the battery control module to close a pre-charge battery output contactor that is in series with a pre-charging resistor (e.g., contactor 452 of FIG. 4) in response to the contactor close request. Closing the pre-charging battery output contactor allows current to flow from the battery to the vehicle power bus thereby increasing the vehicle bus voltage. The contactor status signal remains low between $T_0$ and $T_1$ indicating that the full battery capacity is not available to the vehicle.

At $T_1$ the vehicle bus voltage reaches a level and remains substantially constant thereafter. In one example, the vehicle bus voltage substantially reaches battery voltage at $T_1$. In addition, the contactor status signal changes state from low to high indicating that the primary battery output contactor is closed. In one example, the primary battery output contactor directly couples battery cells to an external load without a pre-charging resistor between battery cells and the external load (e.g., contactor 450 of FIG. 4). In some examples, the pre-charging contactor goes to an open state after the primary contactor is closed. Thus, the sequence illustrated by FIG. 5 is an example procedure for supplying battery charge to an external load via one or more battery output contactors.

Figure 6:
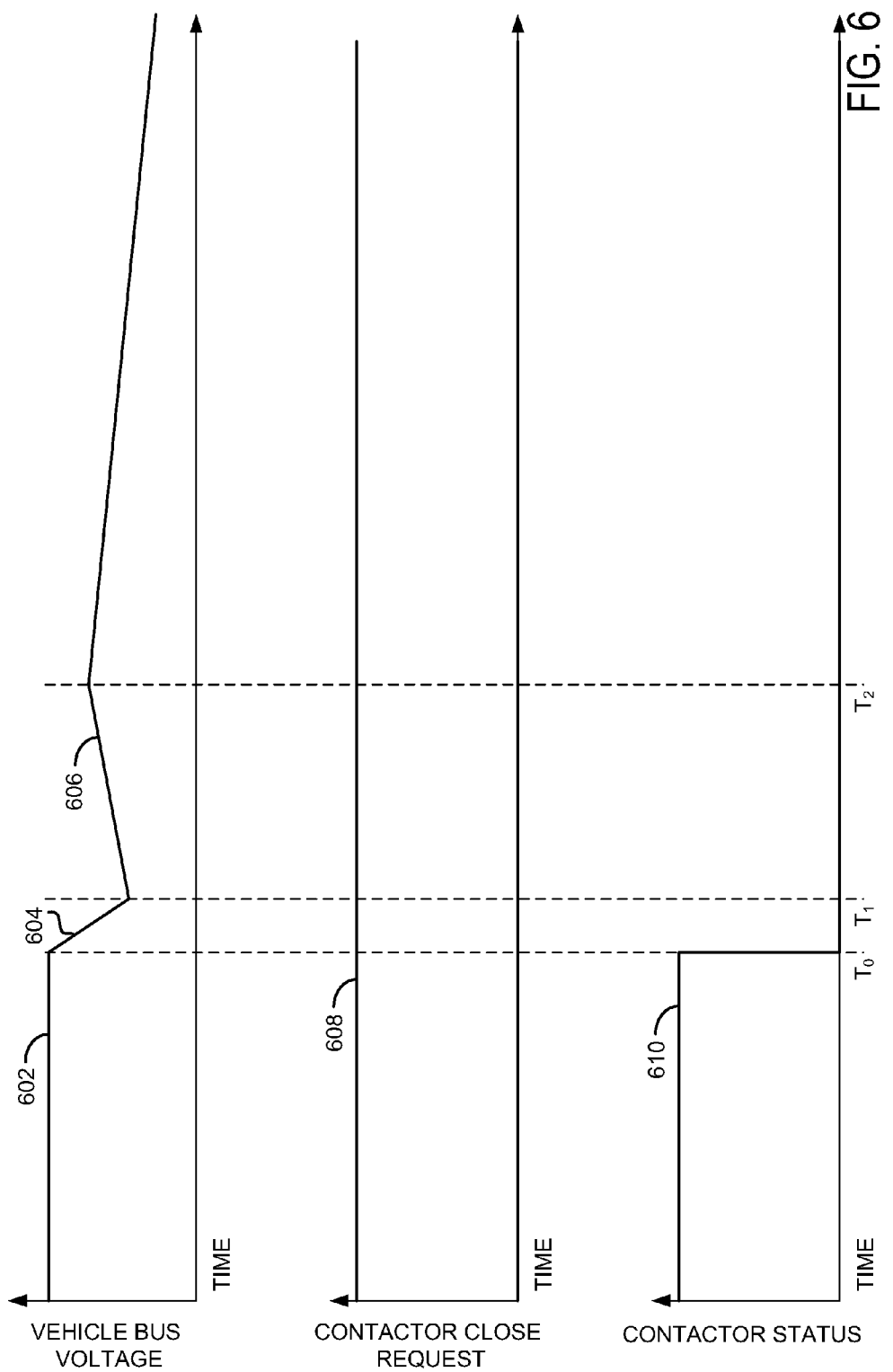
FIG. 6 shows an example plot of simulated signals of interest during a first battery output contactor closing sequence.

Referring now to FIG. 6, an example plot of simulated signals of interest during a first battery output contactor closing sequence is shown. In particular, signals of interest during a battery controller reset are shown. The signals described in FIG. 6 are the same signals described in FIG. 5; however, the signals of FIG. 6 represent signals occurring during different operating conditions. Therefore, for the sake of brevity, the description of signals will be limited to differences in the signals of FIG. 6 as compared to the signals of FIG. 5. In the example illustrated by FIG. 6, the battery control module simply follows instructions from the vehicle control module.

At the left of $T_0$, trace 602 indicates voltage supplied to the vehicle power bus is substantially battery voltage and the contactor close request 608 is high which indicates that the vehicle controller is requesting battery voltage at the vehicle bus. Contactor status signal 610 is also at a high level to the left of time $T_0$ and indicates that the primary battery output contactor is in a closed state.

At $T_0$, the battery pack controller is reset causing the contactor status signal to indicate an open primary battery output contactor. In some examples, the contactor status signal may go to a predetermined state during a battery controller reset. The contactor close signal remains at a high level and indicates that the vehicle controller is requesting battery power to the vehicle bus during the battery controller reset. When the battery controller is reset, the primary battery output contactor transitions to an open state causing vehicle bus voltage to drop at 604 as battery power is consumed by the vehicle load.

At $T_1$, the battery controller completes reset and responds to the contactor close request 608. Since the vehicle controller may not be aware of the battery controller reset, the contactor close request remains at a high state and indicates battery voltage is desired at the vehicle bus. In one example, the battery controller responds by closing the pre-charge battery output contactor. Closing the pre-charge battery output contactor increases the vehicle bus voltage as indicated at 606. However, the vehicle controller may not have uncoupled vehicle loads from the vehicle bus if the vehicle controller was not aware of the battery controller reset. As a result, vehicle bus voltage reaches a peak value at $T_2$ and then declines. The vehicle bus voltage may fall if activating the pre-charge battery output contactor causes a battery pack resistor to degrade, for example. Thus, the signals of FIG. 6 indicate a possible result of closing a battery pack output contactor during a battery controller reset.

Figure 7:
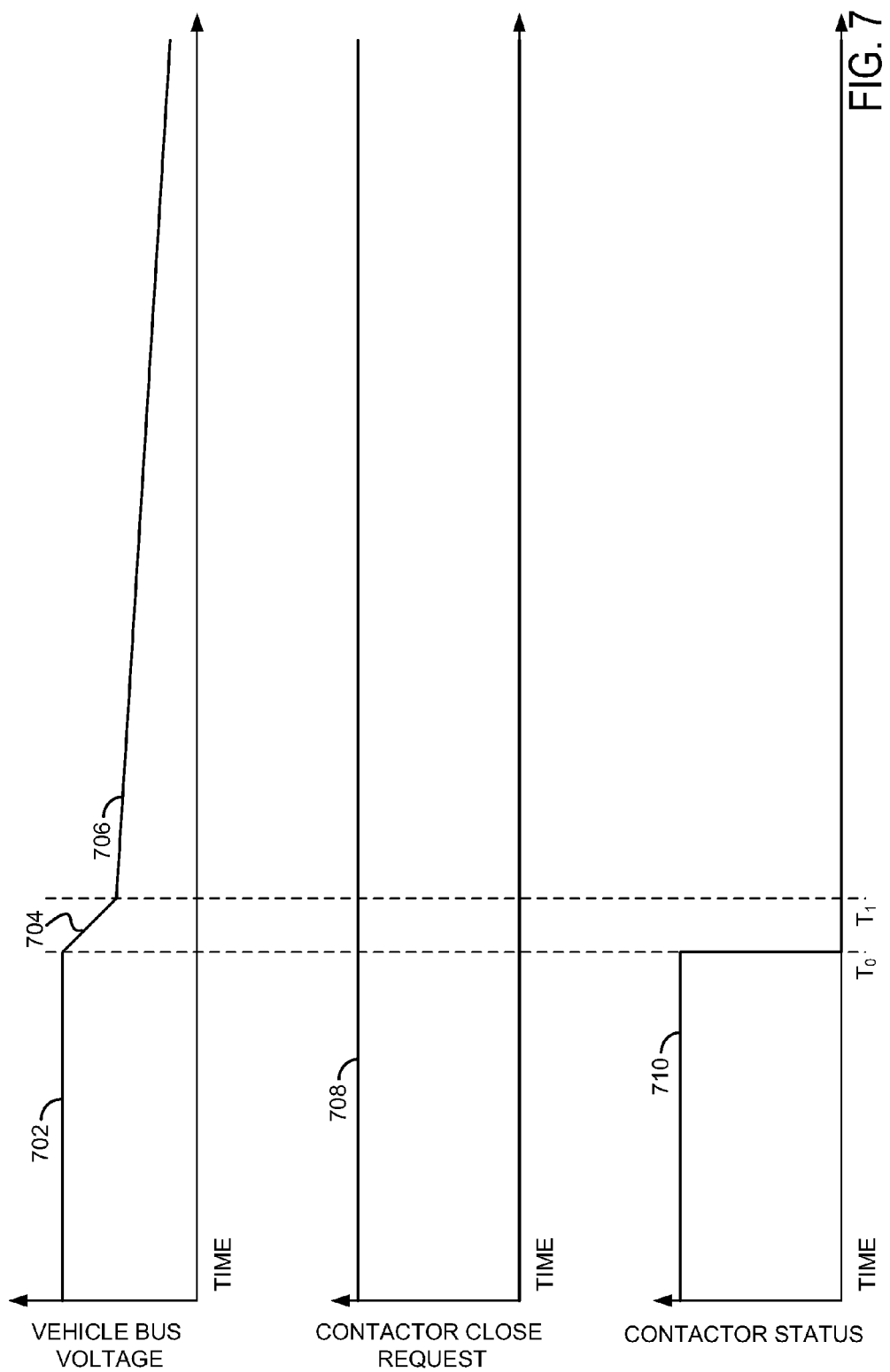
FIG. 7 shows an example plot of simulated signals of interest during a second battery contactor closing sequence.
Figure 8:
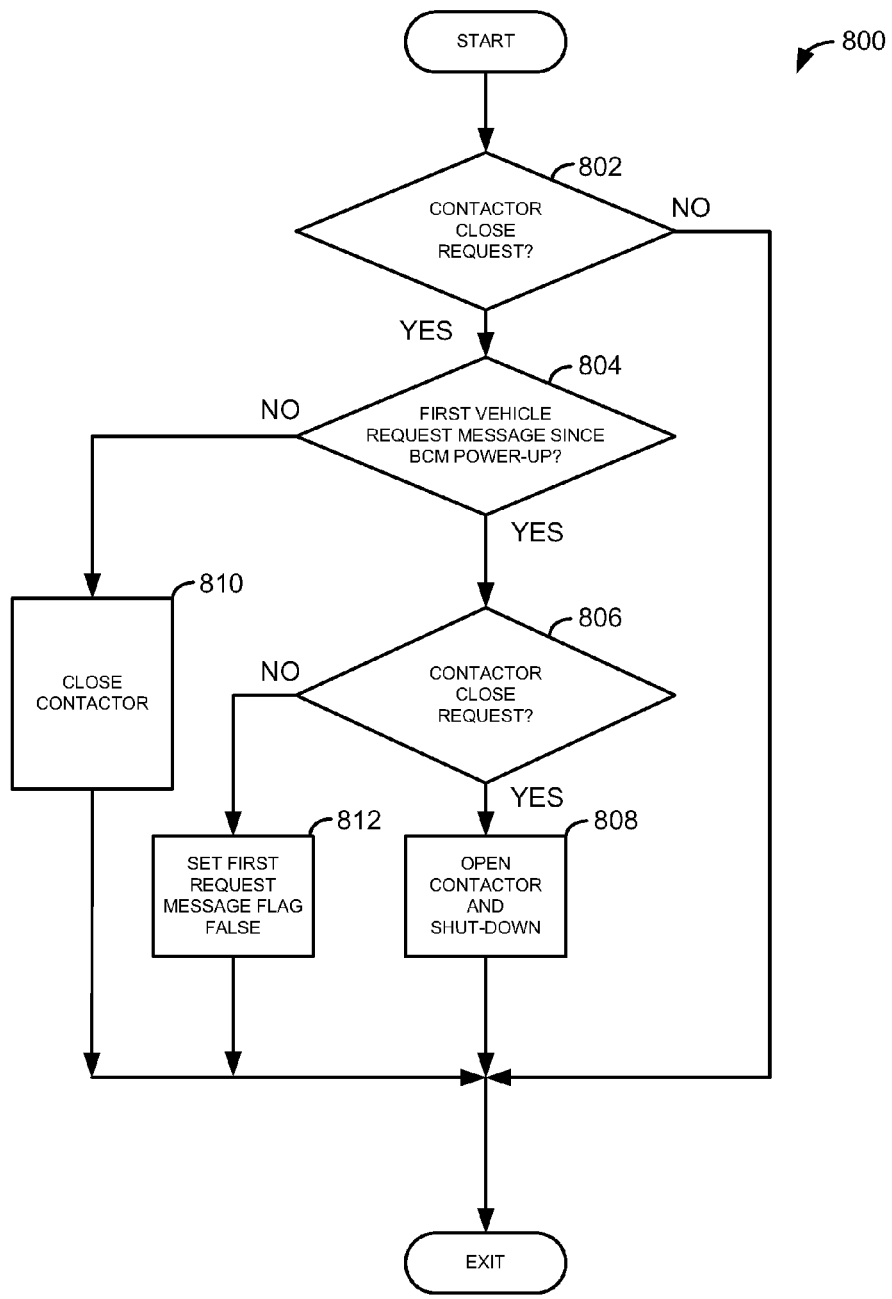
FIG. 8 shows flowchart of a method for controlling output contactors of a battery pack.

Referring now to FIG. 7, an example plot of simulated signals of interest during a second battery output contactor closing sequence is shown. In particular, a battery output contactor closing sequence according to the method of FIG. 8 is shown. The signals described in FIG. 7 are the same signals described in FIGS. 5-6. Therefore, for the sake of brevity, the description of signals will be limited to differences in the signals of FIG. 7 as compared to the signals of FIG. 6.

At the left of $T_0$, trace 702 indicates voltage supplied to the vehicle power bus is substantially battery voltage and the contactor close request 708 is high which indicates that the vehicle controller is requesting battery voltage at the vehicle bus. Contactor status signal 710 is also at a high level to the left of time $T_0$ and indicates that the primary battery output contactor is in a closed state.

At $T_0$, the battery pack controller is reset causing the contactor status signal to indicate an open primary battery output contactor. In some examples, the contactor status signal may go to a predetermined state during a battery controller reset. The contactor close signal remains at a high level and indicates that the vehicle controller is requesting battery power to the vehicle bus during the battery controller reset. When the battery controller is reset, the primary battery output contactor transitions to an open state causing vehicle bus voltage to drop at 704 as battery power is consumed by the vehicle load.

At $T_1$, the battery controller completes reset and responds to the contactor close request 708. Since the vehicle controller may not be aware of the battery controller reset, the contactor close request remains at a high state and indicates battery voltage is desired at the vehicle bus. In this example, the battery controller responds by determining the type of vehicle controller request. Since the vehicle controller is requesting contactor closing, the battery controller leaves the pre-charge battery output contactor and the primary battery output contactor in open states. Consequently, the vehicle bus voltage continues to decay even though the vehicle controller continues to request battery voltage. In one example, the battery controller sends a status signal to the vehicle controller at $T_1$ to indicate that a degraded condition is present. The vehicle controller may respond by requesting a power down sequence so that the battery controller and vehicle controller may be reinitialized from a powered down state.

Referring now to FIG. 8, a flowchart of a method for controlling output of a battery pack is shown. In one example, the method of FIG. 8 is executed upon a reset of a battery control module. A battery module reset may occur after a power down of the battery control module or under select operating conditions (e.g., upon a reset request from a vehicle controller or a degraded electrical connection). During a reset, the microcontroller is re-booted and the stack pointer of a microcontroller is set to a predetermined location so that the microcontroller begins executing instructions according to a predetermined procedure.

At 802, routine 800 judges whether or not there is a contactor close request. The contactor close request may originate from a vehicle controller or from a vehicle sub-system controller (e.g., a motor controller). Further, in one example, the contactor close request may be via a CAN link from a stationary power system controller. In other examples, the contactor close request may be via a digital input. If it is judged that a contactor request is present, routine 800 proceeds to 804. Otherwise, routine 800 proceeds to exit.

At 804, routine 800 judges whether or not the contactor close request is a first request message from an external controller since a battery control module power-up or reset. In one example, a battery controller reset may occur from an external or internal condition. During a battery controller reset a microcontroller reboots and stops executing a series of instructions. Further, a stack pointer in the microcontroller may be reset to a predetermined location so that the microcontroller begins executing instructions from known and predictable conditions. After the stack pointer is reset, a flag indicating the status of a first request message from a controller external the battery pack is set true, and routine 800 looks to a CAN link for a message from an external controller. Once a first request message is received by the battery pack controller from a controller external the battery pack, the first message request flag is set to false at the end of routine 800 so as to indicate that any subsequent messages are not the first request message from the external controller. If a message is received from an external controller and the first request message flag is set to true, routine 800 proceeds to 806. Otherwise, routine 800 proceeds to 810.

At 806, routine 800 judges whether or not the request from the external controller is a contactor close request. If so, routine 800 proceeds to 808. Otherwise, routine 800 proceeds to 812.

At 808, routine 800 holds the battery output contactor or contactors in an open state and enters a shut-down mode. Routine 800 also sends a status message to the external controller (e.g., a vehicle controller or stationary power controller) via the CAN link and indicates a condition of degradation. Routine 800 stays in the shut-down condition until the battery pack is reset by the vehicle controller or until the battery pack is powered down.

At 812, routine 800 sets the first request message flag false. By setting the first request message flag to a false state, routine 800 may proceed to 810 during a subsequent execution of routine 800. In this way, routine 800 provides a check as to the vehicle controller request before battery output is delivered to the vehicle power bus.

At 810, routine 800 closes a contactor in response to a contactor close request by an external controller. In one example, a contactor closing sequence is initiated at 810. In particular, a first contactor is closed initially at 810. The first contactor is a pre-charge contactor and is in electrical series with a pre-charge resistor. Then, once the vehicle bus voltage reaches a predetermined level, a second contactor is closed. The second contactor is in parallel to the first pre-charge contactor and may be described as a primary contactor. The pre-charge contactor is opened after the primary contactor is closed to complete power transfer from the battery to the vehicle load.

Thus, the method of FIG. 8 provides for a method for controlling output of a battery pack having a battery control module and a battery pack output contactor, comprising: resetting said battery control module; powering-up said battery control module from reset; receiving a request from an external controller to open the battery pack output contactor in the powered-up battery control module; and closing the battery pack output contactor after the reset only in response to the receiving request being a first instruction received from the external controller since the reset. The method applies where a battery pack output contactor controls current from a plurality of battery cells through a pre-charge resistor to a load external to said battery pack. However, the method also applies where a battery pack output contactor controls current from a plurality of battery cells to a load external to said battery pack. In one example, the method includes a request made via a CAN link, and where the controller external to said battery pack is a vehicle controller. The method can also include a mode where the battery pack enters a mode where the battery pack output contactor is latched open and where a signal indicating degradation is sent from the battery control module to the controller external to said battery pack. The battery pack may enter this mode when a first request from the controller external to said battery pack is not a request to open the battery pack output contactor. The method also applies where the battery pack is comprised of a plurality of lithium-ion battery cells, and where said battery pack output contactor is a normally open contactor including a closing coil and metallic contacts. Further, the contactor can be in an open state during said battery control module power-up.

The method of FIG. 8 also provides for a method for controlling output of a battery pack having a battery control module and a battery pack output contactor, comprising: initializing the battery control module from a running reset or hardware power-up; receiving a first contactor control request since the initialization of the battery control module, the first contactor control request from an external controller and indicating a request to open or close the battery pack output contactor, the battery pack output contactor remaining open in response to the first contactor control request; receiving a subsequent contactor control request after the first contactor control request, the subsequent contactor control request a request to close the battery pack output contactor; and closing the battery pack output contactor in response to the subsequent contactor control request only in response to the first contactor control request being a contactor open request.

The subject matter of the present disclosure includes all novel and nonobvious combinations and subcombinations of the various systems and configurations, and other features, functions, and/or properties disclosed herein.

As will be appreciated by one of ordinary skill in the art, routines described in FIG. 8 may be represented by instructions for a controller and may be represented by one or more of any number of processing strategies such as event-driven, interrupt-driven, multi-tasking, multi-threading, and the like. As such, various steps or functions illustrated may be performed in the sequence illustrated, in parallel, or in some cases omitted. Likewise, the order of processing is not necessarily required to achieve the objects, features, and advantages described herein, but is provided for ease of illustration and description. Although not explicitly illustrated, one of ordinary skill in the art will recognize that one or more of the illustrated steps or functions may be repeatedly performed depending on the particular strategy being used.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for controlling output of a battery pack having a battery control module and a battery pack output contactor, comprising:
   initializing the battery control module from a running reset or hardware power-up;
   receiving a first contactor control request since the initialization of the battery control module, the first contactor control request from a controller external to the battery pack and indicating a request to open or close the battery pack output contactor, the battery pack output contactor remaining open irrespective of the first contactor control request;
   receiving a subsequent contactor control request from the controller external to the battery pack after the first contactor control request, the subsequent contactor control request a request to close the battery pack output contactor; and
   closing the battery pack output contactor in response to the subsequent contactor control request only in response to the first contactor control request being a contactor open request.

2. The method of claim 1, wherein said battery pack output contactor controls current from a plurality of battery cells through a pre-charge resistor to a load external to said battery pack.

3. The method of claim 1, wherein said battery pack output contactor controls current from a plurality of battery cells to a load external to said battery pack.

4. The method of claim 1, wherein said request is made via a CAN or digital link, and wherein said controller external to said battery pack is a vehicle or system controller.

5. The method of claim 1, further comprising said battery pack entering a mode wherein said battery pack output contactor is latched open and wherein a signal to limit battery pack degradation is sent from said battery control module to the controller external to the battery pack, the battery pack entering the mode when the first contactor control request from the controller external to the battery pack is not a request to open the battery pack output contactor.

6. The method of claim 1, wherein the battery pack is comprised of a plurality of lithium-ion battery cells, and wherein the battery pack output contactor is a normally open contactor including a closing coil and metallic contacts.

7. The method of claim 6, wherein the battery pack output contactor is in an open state during the battery control module initialization.

8. A system for controlling output of a battery pack, comprising:
   a plurality of battery cells;
   a first battery pack output contactor; and
   a battery controller, the battery controller including instructions for receiving a first contactor control request since initialization of the battery controller, the first contactor control request from a controller external to the battery pack and indicating a request to open or close the first battery pack output contactor, the battery controller including further instructions for holding the first battery pack output contactor open irrespective of the first contactor control request, the battery controller including further instructions for receiving a subsequent contactor control request after the first contactor control request, the subsequent contactor control request a request to close the battery pack output contactor, and the battery controller including further instructions for closing the battery pack output contactor in response to the subsequent contactor control request only in response to the first contactor control request being a contactor open request.

9. The system of claim 8, wherein the first battery pack output contactor is electrically coupled in series between the plurality of battery cells and a load external to the battery pack.

10. The system of claim 9, wherein the first battery pack output contactor is a normally open contactor including a closing coil and metallic contacts.

11. The system of claim 9, wherein the first battery pack output contactor is configured to control current flow through a pre-charge resistor, and the system further comprising a second battery pack output contactor, the second battery pack output contactor electrically coupled in series between the plurality of battery cells and the load, the second battery pack output contactor electrically coupled in series with the first battery pack output contactor.

12. The system of claim 8, wherein the battery controller includes further instructions for indicating a request limiting battery pack degradation to the controller external to the battery pack.

13. The system of claim 12, wherein the controller external to the battery pack is a vehicle controller, and wherein the battery controller includes further instructions for holding the first battery pack output contactor in an open state when the first request is not a request to open the first battery pack output contactor.

14. The system of claim 8, wherein the plurality of battery cells are configured in a plurality of battery modules, and wherein said plurality of battery cells are lithium-ion battery cells.

15. A system for controlling output of a battery pack, comprising:
a plurality of battery cells;
a first module including:
a first battery pack output contactor, the first battery pack output contactor configured to regulate current flow between the plurality of battery cells and a load external to said battery pack, the first battery pack output contactor also configured to regulate current flow through a pre-charge resistor; and
a second battery pack output contactor, the second battery pack output contactor configured to regulate current flow between the plurality of battery cells and a load external to the battery pack, the second battery pack output contactor electrically coupled in parallel to the first battery pack output contactor;
a second module including a controller in communication with the first module, the controller including instructions for receiving a first contactor control request since initialization of the controller, the first contactor control request from a controller external to the battery pack and indicating a request to open or close the first battery pack output contactor, the controller including further instructions for holding the first battery pack output contactor open irrespective of the first contactor control request, the controller including further instructions for receiving a subsequent contactor control request after the first contactor control request, the subsequent contactor control request a request to close the first battery pack output contactor, the controller including further instructions for closing the first battery pack output contactor in response to the subsequent contactor control request only in response to the first contactor control request being a contactor open request, and the controller including further instructions for closing the second battery pack output contactor after closing the first battery pack output contactor.

16. The system of claim 15, further comprising a CAN link from the controller to the controller external to the battery pack.

17. The system of claim 15, wherein the controller includes further instructions for indicating a request to limit battery pack degradation to the controller external to the battery pack.

18. The system of claim 15, wherein the controller includes further instructions for holding the first battery pack output contactor in an open state when the first contactor control request is not a request to open the first battery pack output contactor.

19. The system of claim 15, wherein said plurality of battery cells are configured in a plurality of battery modules, and wherein said plurality of battery cells are lithium-ion battery cells.

20. The system of claim 15, wherein the controller includes further instructions for opening the first battery pack output contactor after closing the second battery pack output contactor.

* * * * *